United States Patent
Blankenship et al.

(10) Patent No.: US 6,952,457 B2
(45) Date of Patent: Oct. 4, 2005

(54) METHOD AND SYSTEM FOR ADAPTING A TRAINING PERIOD IN A TURBO DECODING DEVICE

(75) Inventors: Thomas Keith Blankenship, Streamwood, IL (US); Brian Keith Classon, Palatine, IL (US); Vipul Anil Desai, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 843 days.

(21) Appl. No.: 09/974,020

(22) Filed: Oct. 10, 2001

(65) Prior Publication Data

US 2002/0118776 A1 Aug. 29, 2002

Related U.S. Application Data

(60) Provisional application No. 60/259,059, filed on Dec. 29, 2000.

(51) Int. Cl.[7] .................................................. H04L 27/06
(52) U.S. Cl. ........................ 375/340; 375/262; 375/341
(58) Field of Search ................................... 375/262, 265, 375/316, 340, 341; 714/755, 786, 792, 794, 795

(56) References Cited

U.S. PATENT DOCUMENTS

| 5,933,462 | A | | 8/1999 | Viterbi et al. | |
|---|---|---|---|---|---|
| 6,510,536 | B1 | * | 1/2003 | Crozier et al. | 714/755 |
| 6,813,743 | B1 | * | 11/2004 | Eidson | 714/795 |
| 6,829,313 | B1 | * | 12/2004 | Xu | 375/341 |
| 6,856,657 | B1 | * | 2/2005 | Classon et al. | 375/341 |
| 6,868,132 | B1 | * | 3/2005 | Classon et al. | 375/341 |

* cited by examiner

*Primary Examiner*—Chieh M. Fan
(74) *Attorney, Agent, or Firm*—Kenneth A. Haas

(57) ABSTRACT

A method of processing an information sequence with a decoder is provided. A window within the information sequence is selected. A training period is calculated for the window. At least one recursion of the window is initialized based on the calculated training period. Systems and programs for processing the information sequence are also provided.

19 Claims, 4 Drawing Sheets

METHOD AND SYSTEM FOR ADAPTING A TRAINING PERIOD IN A TURBO DECODING DEVICE

CROSS REFERENCE TO RELATED APPLICATIONS

This application claims the benefit of provisional U.S. patent application Ser. No. 60/259,059 filed Dec. 29, 2000, to inventors Blankenship et al., herein incorporated by reference in its entirety.

FIELD OF THE INVENTION

The present invention relates generally to the field of communication systems. In particular, the present invention provides a method of tailoring a training period for use in turbo decoding based on the quality of the received signal and on the decoding iteration.

BACKGROUND OF THE INVENTION

In a communication system, channel coding schemes may typically be employed for error correction. For instance, turbo codes may be used for reliable communications over a wireless channel. A variety of methods may be employed to decode these channel coding schemes. For example, turbo codes are generally decoded using an iterative decoding technique. Some iterative decoding techniques process results from an underlying algorithm. For instance, a maximum a posteriori (MAP) algorithm, a variant such as the max-log-MAP or log-MAP, or a similar type of algorithm is generally used to decode a constituent code within a turbo code. The MAP algorithm may be referred to as a decoder. The results from the MAP algorithm, such as output log-likelihood ratios (LLRs), can then be used or modified for further decoding iterations. The MAP algorithm uses forward and backward recursions to update probability metrics and subsequently decode the constituent code. However, the MAP algorithm requires memory proportional to the frame size. In some standards, the frame sizes may reach up to 20,728 bits. Because the memory requirements of the MAP algorithm are proportional to the frame size, the amount of memory necessary to implement the MAP algorithm is a serious concern. For example, for a frame size of 20,728 bits and an eight-state constituent code, 2.65 Mbits of memory is required.

To alleviate these memory requirements, windowing techniques are frequently employed. In conventional windowing techniques, a frame is divided into windows. The MAP algorithm is performed one window at a time and thus only requires an amount of memory proportional to the window size.

However, while memory requirements are reduced, these conventional windowing techniques may not produce results that are as reliable as those produced without windowing. The results are not as reliable because the initial conditions for the forward recursion at the beginning of the window or the backward recursion at the end of the window are unknown, and must be estimated through a training procedure. Training recursions are run forward from a time before the beginning of the window or backward from a time after the end of the window to obtain reliable metric values for the initial conditions at the beginning and end of the window. The training period is often set to 32 or more, which may provide acceptable performance degradation from the un-windowed MAP algorithm. Because the training is required for each window and the training period is the same for each window, an increase in the complexity of the windowing technique results. In some instances, the training period is equal to the window size. This doubles the complexity of a forward or backward recursion.

Because the training period is fixed over all signal-to-noise ratios (SNRs) and over all iterations, the training cost remains the same for poor channel conditions as for better conditions and for all decoding iterations.

It would be desirable therefore to provide a method of training in a turbo decoder that overcomes the above.

DETAILED DESCRIPTION OF THE PRESENTLY PREFERRED EMBODIMENTS

Figure 1:
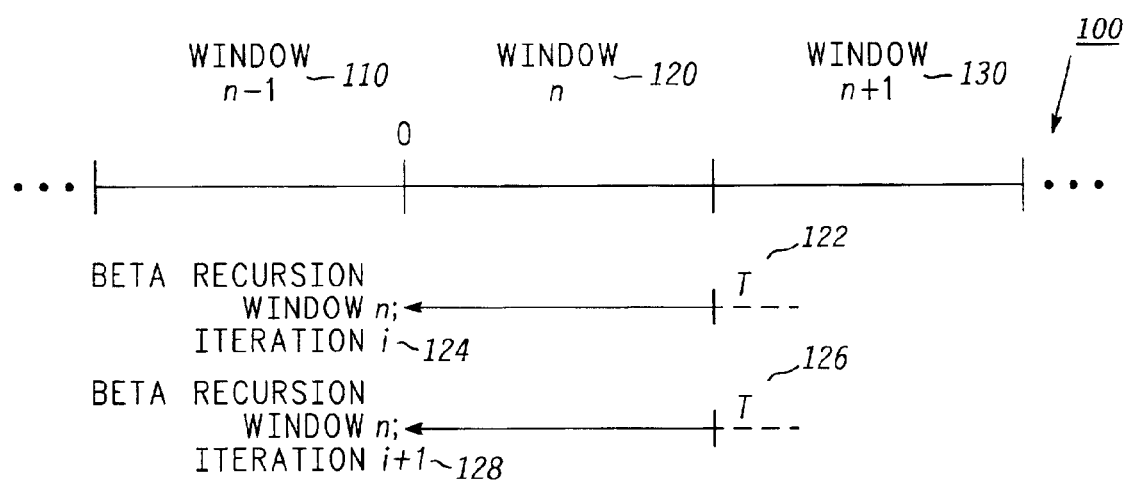
FIG. 1 is a schematic representation of an information burst that may be decoded in accordance with the present invention.

FIG. 1 shows a schematic representation of an information burst that may be decoded in accordance with one embodiment of the present invention at 100. The term "burst" appearing herein may refer to a short or isolated transmission, a portion of a longer transmission, a portion of a continuous transmission, a portion of a semi-continuous transmission, a time-limited transmission, a bandwidth-limited transmission, or any combination thereof.

Information burst 100 may include coded or uncoded source information. Information burst 100 comprises any suitable number of information bits. Information burst 100 may be transmitted from any suitable transmitting device to any suitable receiving device. For example, information burst 100 may be transmitted from a base station to a wireless cellular device. Alternatively, a cellular device may transmit information burst 100 to a base station.

In one embodiment of the invention, information burst 100 is intended to be decoded by an iterative algorithm that applies a forward-backward algorithm on a trellis. For example, the information burst 100 may be intended for a turbo decoder using a MAP algorithm, or another decoder using iterations and probability propagation.

As seen in FIG. 1, information burst 100 may be processed with one embodiment of the present invention. In the embodiment of FIG. 1, information burst 100 has a size of $N_i$ symbols. For example, $N_i$ can be 640 information bits. Information burst 100 may be divided into two or more windows 110, 120, and 130. These windows may be of differing size. Alternatively, as seen in FIG. 1, the windows 110, 120 and 130 may have the same size. Windows 110, 120 and 130 may be three windows out of a large number of total windows depending, for example, on the size of the information burst. For example, in an embodiment where information burst 100 has a size of $N_i$=640 information bits, windows 110, 120, 130 could be three windows out of ten total windows, each containing 64 information bits.

Each window 110, 120, 130 of information burst 100 may be processed with an algorithm, such as, for example, a MAP algorithm. In one embodiment of the invention, a window management function controls the processing of each window. In general, the windows may be processed in any order. For example, in one embodiment, all windows are processed simultaneously in parallel. In another embodiment, the windows are processed from the front of information burst 100 to the back of the information burst 100 in sequential order. In yet another embodiment, the windows are processed from the back of information burst 100 to the front of information burst 100 in reverse sequential order.

In order to process a window 120 (e.g., window n) with a MAP algorithm, the forward ($\alpha$) recursion is initialized at the beginning of the window, and the backward ($\beta$) recursion is initialized at the end of the window. If the window management results in window 110 (e.g., window n−1) being processed before window 120 (e.g., window n) is processed, window 120 (e.g., window n) may initialize its forward recursion by copying the final value of the forward recursion of window 110 (e.g., window n−1). Similarly, if the window management function results in window 130 (e.g., window n+1) being processed before window 120 (e.g., window n) is processed, window 120 (e.g., window n) may initialize its backward recursion by copying the final value of the backward recursion for window 130 (e.g., window n+1). In general, at least one of either the forward or the backward recursion initialization for window 120 (e.g., window n) is unknown. In accordance with one aspect of the present invention, the unknown initialization is determined by a training recursion that starts outside of the selected window, where the training period depends on the window size, signal-to-noise ratio (SNR) or other signal quality measure, and decoding iteration number. For example, the training period may be non-decreasing with increasing SNR or increasing iteration number. In an embodiment where the windows are selected sequentially and training is only necessary for the backward recursion, the training period 122 (e.g., training period T) for the $\beta$ recursion for iteration 124 (e.g., iteration i) will be less than or equal to the training period 126 (e.g., training period T) for the $\beta$ recursion for iteration 128 (e.g., iteration i+1).

Figure 2:
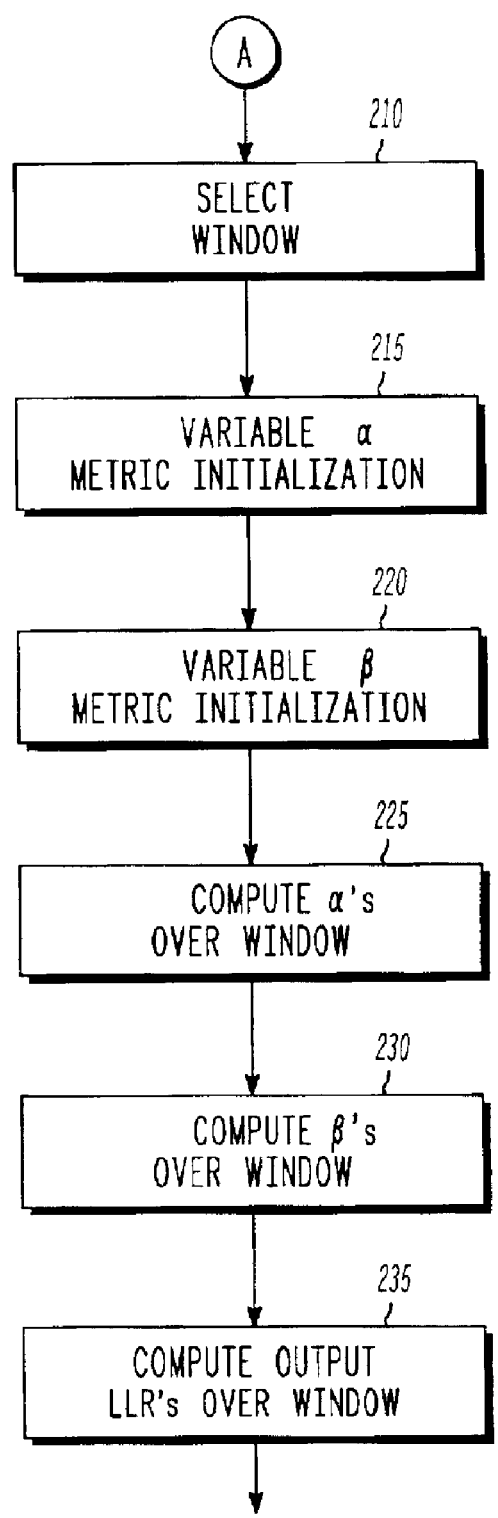
FIG. 2 is a flow diagram of one embodiment of a method for processing a window in an information burst in accordance with the present invention.

FIG. 2 is a flow diagram of one embodiment of a method of processing a window in an information burst in accordance with the present invention at 200. A indicates a period before the processing of a window such as, for example, window 120 (e.g., window n) described above. During period A, a window adjacent to window 120 (e.g., window n) such as, for example, window n−1 or window n+1 may be processed. Alternatively, during period A, an information burst may be divided into windows as described above where window 120 (e.g., window n) is processed at the same time or before windows n−1 and n+1.

At block 210, a window is selected for processing. This window may be one of the windows 110, 120, 130 in information burst 100 as described above. In one embodiment of the invention, the window is processed using the MAP algorithm shown below:

$$L_k = \ln\frac{P(u_k=+1|y)}{P(u_k=-1|y)} = \ln\frac{\sum_{\substack{(s',s) \\ u_k=+1}} p(s',s,y)}{\sum_{\substack{(s',s) \\ u_k=-1}} p(s',s,y)} = \ln\frac{\sum_{\substack{(s',s) \\ u_k=+1}} \alpha_{k-1}(s')\gamma_k(s',s)\beta_k(s)}{\sum_{\substack{(s',s) \\ u_k=-1}} \alpha_{k-1}(s')\gamma_k(s',s)\beta_k(s)}$$

The quantity p(s',s,y) may be the joint probability of the branch that goes from state s' to state s during the kth section of the code trellis and the entire received sequence y (e.g., information burst).

Because of the underlying Markov nature of the code, this probability may be broken up into a product of three probabilities: past $\alpha_{k-1}(s')=p(s',y_{j<k})$, present $\gamma_k(s',s)=p(s,y_k|s')$, and future $\beta_k(s)=p(y_{j>k}|s)$. The $\alpha$ and $\beta$ probabilities may be calculated through generalized forward and backward recursions, respectively, on the code trellis, each of which involves sums of products of probabilities.

After selecting a window, the $\alpha$ probabilities ($\alpha$'s) for the beginning step and the $\beta$ probabilities ($\beta$'s) for the final step of the window may be initialized as seen at blocks 215, 220. Depending upon how the windows are processed, this may be done by copying metrics from adjacent windows or by training. The initialization in blocks 215 and 220 may be labeled variable $\alpha$ metric initialization and variable $\beta$ metric initialization because, for any given window, one of either $\alpha$ metric initialization or $\beta$ metric initialization may be determined through training, where the training period depends on both the SNR and the iteration number as described above.

In one embodiment of the invention, the initial $\alpha$'s are obtained through training at block 215. In this embodiment, the final $\beta$'s are obtained through training at block 220. This embodiment may be used, for example, when all windows 110, 120, 130 are processed simultaneously in parallel.

In another embodiment of the invention, the initial $\alpha$'s are obtained by copying the final $\alpha$'s from the preceding window at block 215. In this embodiment, the final $\beta$'s are obtained through training at block 220. This embodiment may be used, for example, when windows 110, 120, 130 are processed sequentially from the front to the back of the information burst 100. For example, in FIG. 1, the initial $\alpha$'s for window 120 (e.g., window n) are obtained by copying the final $\alpha$'s from window 110 (e.g., window n−1).

In yet another embodiment of the invention, the initial $\alpha$'s are obtained through training at block 215. In this embodiment, the initial $\beta$'s are obtained by copying the final $\beta$'s from the succeeding window at block 220. This embodiment may be used, for example, when windows 110, 120, 130 are processed reverse sequentially from the back to the front of information burst 100. For example, in FIG. 1, the initial $\beta$'s for window 120 (e.g., window n) are obtained by copying the final $\beta$'s from window 130 (e.g., window n+1).

In one embodiment of the invention, initialization at blocks 215 and 220 may occur as shown in FIG. 2 (i.e., $\alpha$'s initialized then $\beta$'s initialized). Alternatively, initialization may occur at block 220 followed by initialization at block 215 (i.e., $\beta$'s initialized then $\alpha$'s initialized), or the initializations in block 215 and block 220 may occur at the same time.

At block 225, the $\alpha$'s may be computed over the window. This step may be accomplished using any suitable method known in the art.

At block 230, the $\beta$'s may be computed over the window. This step may be accomplished using any suitable method known in the art.

In one embodiment of the invention, the step described at block 230 may occur before block 225. Alternatively, the step described at block 230 may occur at the same time as block 225.

At block 235, the LLRs may be computed over the window. This step may be accomplished using any suitable method known in the art.

Figure 3:
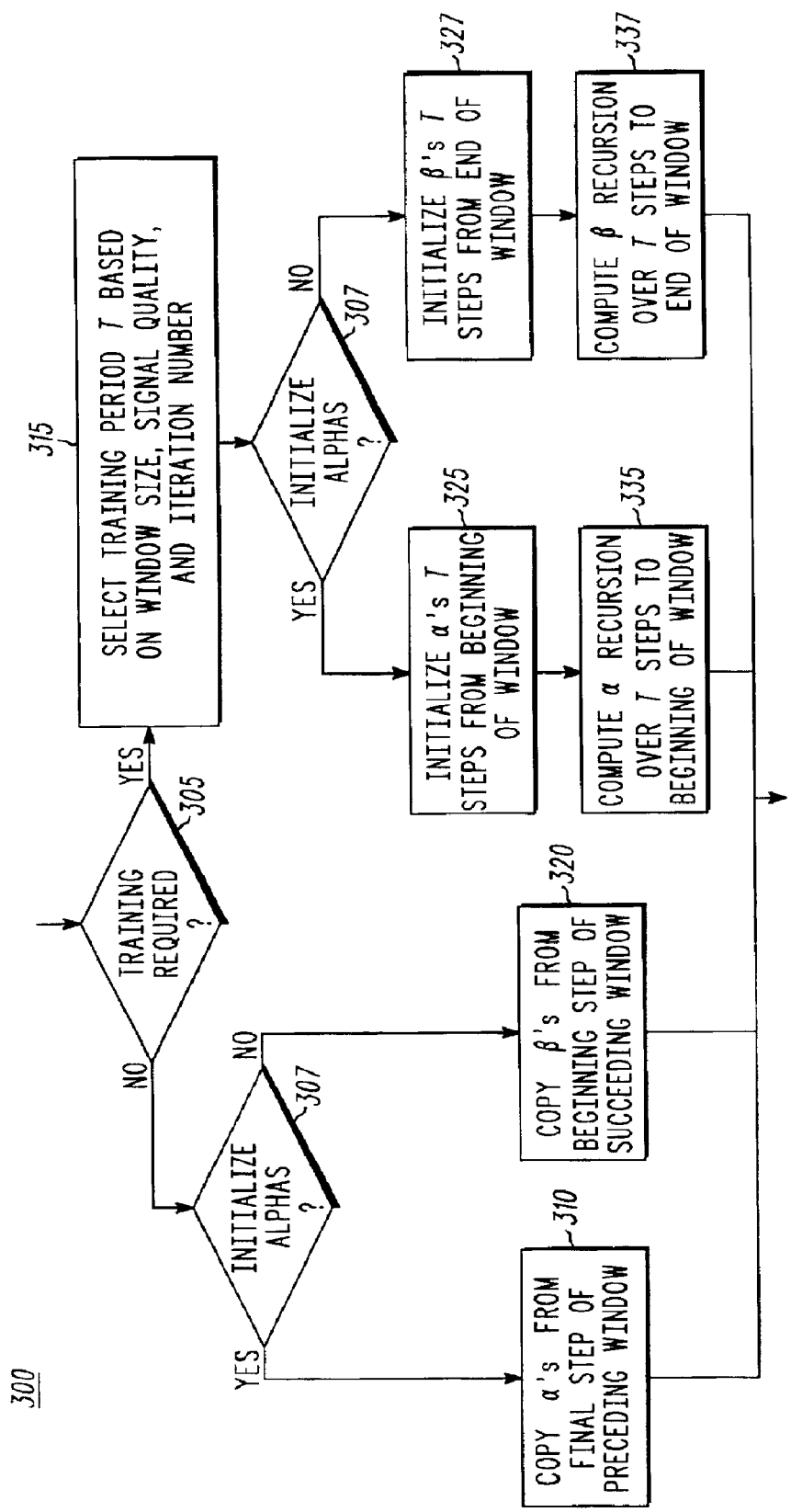
FIG. 3 is a flow diagram of one embodiment of a subroutine of the method shown in FIG. 2.

FIG. 3 shows a flow diagram of one embodiment of a subroutine in accordance with the present invention at 300. The subroutine of FIG. 3 may take place, for example, during either block 215 or block 220 in FIG. 2. The embodiment of FIG. 3 may be, for example, a variable $\alpha$ or β metric initialization function specifying initialization in accordance with the present invention.

The variable metric initialization function 300 may occur for the variable α metric initialization 215 or the variable β metric initialization 220. Decision blocks 307 enable function 300 to be valid for both α and β initializations. In one embodiment of the invention, the function 300 may be working to perform α initialization. In addition, variable metric initialization function 300 may indicate that initialization will occur by copying, for example, as indicated by decision block 305. In this embodiment, the α's from the final step of the preceding window will be copied as the initial α's for this window (at block 310).

In another embodiment of the invention, the function 300 may be working to perform β initialization, as determined by decision block 307, while the initialization will occur by copying, as determined by decision block 305. In this embodiment, the β's from the beginning step of the succeeding window are copied as the initial β's for the current window (at block 320).

The variable metric initialization function 300 may indicate that initialization will occur by training, as determined by decision block 305. In this case, a training period T may be selected at block 315. In accordance with the present invention, for a set window size, the training period may be a function of the signal quality and iteration. In one embodiment of the invention, the following function may be used to describe the training period:

$$T\left(\frac{E_b}{N_0}, i\right) = \begin{cases} \left\lceil \frac{(i-1)T_{max}}{I_{max}} \right\rceil, & 1 \leq i \leq I_{max} \\ T_{max}, & i > I_{max} \end{cases}$$

where $E_b/N_0$ is the signal-to-noise ratio per bit, i is the iteration number, and $T_{max}$ and $I_{max}$ are parameters dependent upon $E_b/N_0$. For iterations after iteration $I_{max}$, $T_{max}$ is used as the training period. In a preferred embodiment, $I_{max}$ is non-decreasing with increasing $E_b/N_0$, and $T_{max}$ is non-decreasing with increasing iteration and $E_b/N_0$.

For example, in one embodiment of the present invention, the information burst size may be 640 bits and a window size of 32 steps may be used, thus resulting in 20 windows. In such a case, choosing $$I_{max} = \left\lfloor 2\frac{E_b}{N_0} \right\rfloor + 2$$

and $$T_{max} = \left\lceil 16\frac{E_b}{N_0} \right\rceil + 4,$$

where $E_b/N_0$ is expressed in dB, results in near-optimal performance. Previously, a fixed training period size has been used regardless of signal quality and iteration. The present invention may achieve nearly the same decoding performance as previously used techniques. However, the present invention uses much shorter training periods and therefore less computational complexity than previous techniques.

Once the training period T is established at block 315, the starting metrics for the training recursions (indicated at either block 325 or block 327) may be set. This may be done using any suitable method known in the art. This may be done, for example, by setting the metric for each state to zero. Alternatively, the metric for each state may be set to some other fixed value or to random values. Alternatively, the metric for each state may be set to whatever happens to be in the memory locations in which the metrics are intended to be stored.

In one embodiment of the invention, as determined by decision block 307, the training recursion for the α's may be started T steps from the beginning of the window (as seen at block 325). Alternatively, the training recursion for the β's may be started T steps from the end of the window (as seen at block 327).

Then, as determined by decision block 307, at block 335, an α recursion may be performed over the T steps prior to the initial step of the window up to the initial step of the window. Alternatively, at block 337, a β recursion may be performed over the T steps following the final step of the window back to the final step of the window.

Figure 4:
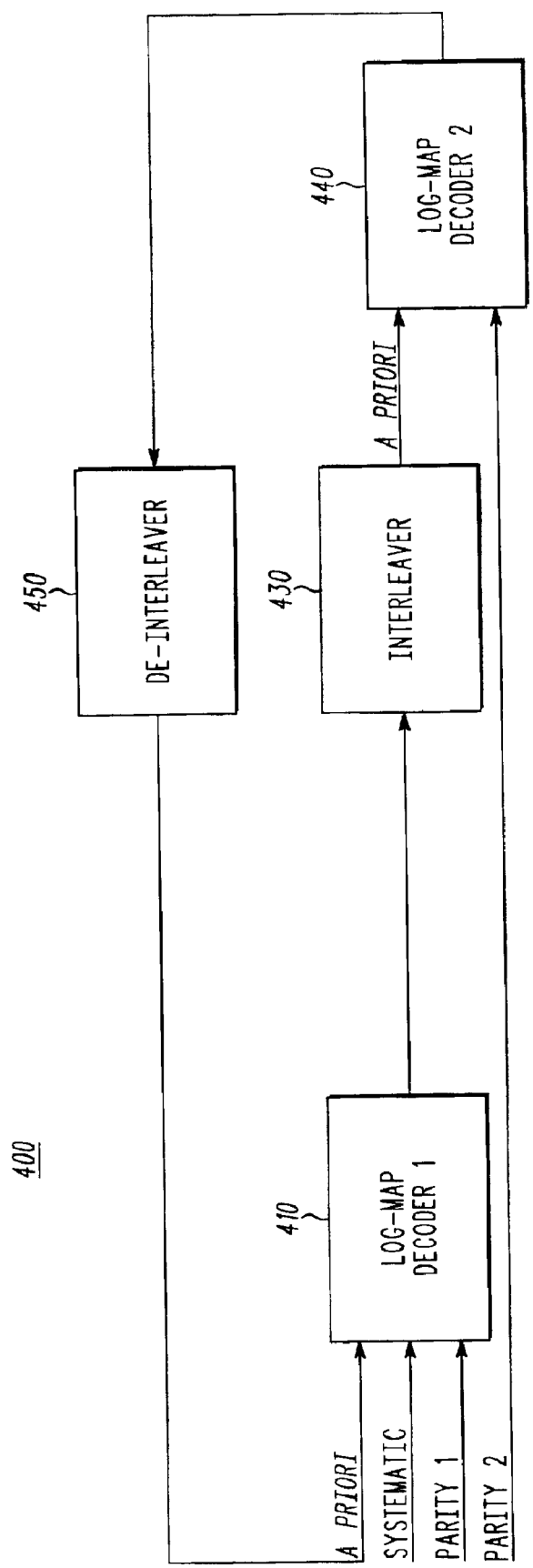
FIG. 4 is a schematic representation of one embodiment of a turbo decoding device that may be used in accordance with the present invention.

FIG. 4 shows a schematic representation of a turbo decoding system in accordance with the present invention at 400. Turbo decoding system 400 may include at least one log-MAP decoder 410. In the embodiment of FIG. 4, turbo decoding system 400 also includes a second log-MAP decoder 440. Alternatively, MAP or MAP variants may be used instead of log-MAP decoders. Turbo decoding system 400 may also include an interleaver 430 and a de-interleaver 450.

While specific embodiments of the present invention have been shown and described, it will be apparent to those skilled in the art that the disclosed invention may be modified in numerous ways and may assume many embodiments other than those specifically set out and described above. Accordingly, the scope of the invention is indicated in the appended claims, and all changes that come within the meaning and range of equivalents are intended to be embraced therein.

What is claimed is:

1. A method of processing an information sequence with a decoder, comprising:
   selecting a window within the information sequence;
   calculating a training period for the window;
   initializing at least one recursion of the window based on the calculated training period; and
   calculating the training period based on a signal quality of the window, wherein the training period is non-decreasing as the signal quality increases.

2. The method of claim 1 wherein the recursion is a forward recursion.

3. The method of claim 1 wherein the recursion is a backward recursion.

4. The method of claim 1 further comprising:
   dividing the information sequence into at least two windows.

5. The method of claim 1 further comprising:
   calculating the training period based on a size of the window.

6. The method of claim 1 wherein the decoder is iterative.

7. The method of claim 1 further comprising:
   selecting an additional window; and
   computing an additional training period for the additional window based on the training period of the window.

8. A turbo decoding system comprising:
   means for selecting a window within an information sequence;
   means for calculating a training period for the window;
   means for initializing at least one recursion of the window based on the calculated training period;
   means for calculating the training period based on an iteration number, wherein the training period is non-decreasing as the iteration number increases; and
   wherein the turbo decoding system is iterative.

9. The system of claim 8, further comprising:
means for dividing the information sequence into at least two windows.

10. The system of claim 8, further comprising:
means for calculating the training period based on a size of the window.

11. The system of claim 8, further comprising:
means for calculating the training period based on a signal quality of the window.

12. The system of claim 8, further comprising:
at least one interleaver.

13. The system of claim 8, further comprising:
at least one de-interleaver.

14. A method of processing an information sequence with a decoder, comprising:
selecting a window within the information sequence;
calculating a training period for the window;
initializing at least one recursion of the window based on the calculated training period; and
calculating the training period based on an iteration number, wherein the training period is non-decreasing as the iteration number increases and the decoder is iterative.

15. The method of claim 14 wherein the recursion is a forward recursion.

16. The method of claim 14 wherein the recursion is a backward recursion.

17. The method of claim 14 further comprising:
dividing the information sequence into at least two windows.

18. The method of claim 14, further comprising:
calculating the training period based on a size of the window.

19. The method of claim 14 further comprising:
selecting an additional window; and
computing an additional training period for the additional window based on the training period of the window.

* * * * *